(12) United States Patent
Ichiki

(10) Patent No.: US 9,343,508 B2
(45) Date of Patent: May 17, 2016

(54) WAFER FOR FORMING IMAGING ELEMENT, METHOD FOR MANUFACTURING SOLID-STATE IMAGING ELEMENT, AND IMAGING ELEMENT CHIP

(71) Applicant: FUJIFILM CORPORATION, Tokyo (JP)

(72) Inventor: Takahiko Ichiki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/496,910

(22) Filed: Sep. 25, 2014

(65) Prior Publication Data

US 2015/0048352 A1    Feb. 19, 2015

Related U.S. Application Data

(63) Continuation of application No. PCT/JP2013/002010, filed on Mar. 25, 2013.

(30) Foreign Application Priority Data

Mar. 30, 2012    (JP) ................................. 2012-078609

(51) Int. Cl.
*G01R 31/26*    (2014.01)
*H01L 27/30*    (2006.01)
(Continued)

(52) U.S. Cl.
CPC ........ *H01L 27/307* (2013.01); *H01L 27/14603* (2013.01); *H01L 51/0031* (2013.01); *G01R 31/2831* (2013.01); *G01R 31/2884* (2013.01); *H01L 51/441* (2013.01); *H01L 51/448* (2013.01)

(58) Field of Classification Search
CPC .................. H01L 27/14609; H01L 27/14643; H01L 2924/14; H01L 27/14687; H01L 27/1464; H01L 27/14601; H01L 27/307; H01L 27/14641; H01L 27/14625; H01L 27/14689; H01L 27/3244; H01L 27/14806; H01L 51/424
USPC ......... 438/14–18, 29, 60, 65, 69, 75
See application file for complete search history.

(56) References Cited

U.S. PATENT DOCUMENTS 7,659,499 B2 * 2/2010 Maehara ........... H01L 27/14647
250/208.1
8,987,852 B2 * 3/2015 Okabe ............... H01L 27/14641
257/432

(Continued)

FOREIGN PATENT DOCUMENTS

JP    05-013520 A    1/1993
JP    08-293836 A    11/1996
(Continued)

OTHER PUBLICATIONS

An Office Action; "Notification of Grounds for Rejection," issued by the Japanese Patent Office on Jan. 13, 2015, which corresponds to Japanese Patent Application No. 2012-078609 and is related to U.S. Appl. No. 14/496,910; with English language partial translation.
(Continued)

*Primary Examiner* — Hsien Ming Lee
(74) *Attorney, Agent, or Firm* — Studebaker & Brackett PC

(57) ABSTRACT

A wafer for forming an imaging element has a test pattern and a plurality of imaging element units. The wafer has an imaging region which includes a great number of photoelectric conversion pixels, an imaging element units and a test pattern. The test pattern includes a testing organic photoelectric conversion film and a testing counter electrode having the same configuration and formed at the same time as the organic photoelectric conversion film and a counter electrode, respectively of the photoelectric conversion pixels. A first testing terminal is electrically connected to the undersurface side of the testing organic photoelectric conversion film, and a second testing terminal is electrically connected to the testing counter electrode. A protective film is formed over the entire semiconductor wafer so as to cover the imaging region and the test pattern, and is then partially removed so that a part of each testing terminal is exposed.

1 Claim, 9 Drawing Sheets

(51) Int. Cl.
  *H01L 27/146* (2006.01)
  *H01L 51/00* (2006.01)
  *G01R 31/28* (2006.01)
  *H01L 51/44* (2006.01)

(56) References Cited

U.S. PATENT DOCUMENTS

| | | | |
|---|---|---|---|
| 2006/0196533 A1 | 9/2006 | Maehara | |
| 2007/0012955 A1* | 1/2007 | Ihama | H01L 27/14621 257/233 |
| 2011/0049665 A1* | 3/2011 | Goto | H01L 27/307 257/459 |
| 2013/0009044 A1 | 1/2013 | Inomata | |

FOREIGN PATENT DOCUMENTS

| | | | | |
|---|---|---|---|---|
| JP | 2004-207487 A | 7/2004 | | |
| JP | 2006-202865 A | 8/2006 | | |
| JP | 2006-245045 A | 9/2006 | | |
| JP | 2008-028111 A | 2/2008 | | |
| JP | 2008-204767 A | 9/2008 | | |
| JP | WO 2011/115126 | * | 9/2011 | ............ H01L 22/32 |
| JP | 2011-216853 A | 10/2011 | | |

OTHER PUBLICATIONS

International Search Report; PCT/JP2013/002010; Jun. 11, 2013.

An Office Action; "Grounds for Rejection," issued by the Korean Patent Office on Jan. 15, 2016, which corresponds to Korean Patent Application No. 10-2014-7030266 and is related to U.S. Appl. No. 14/496,910; with English language partial translation.

* cited by examiner

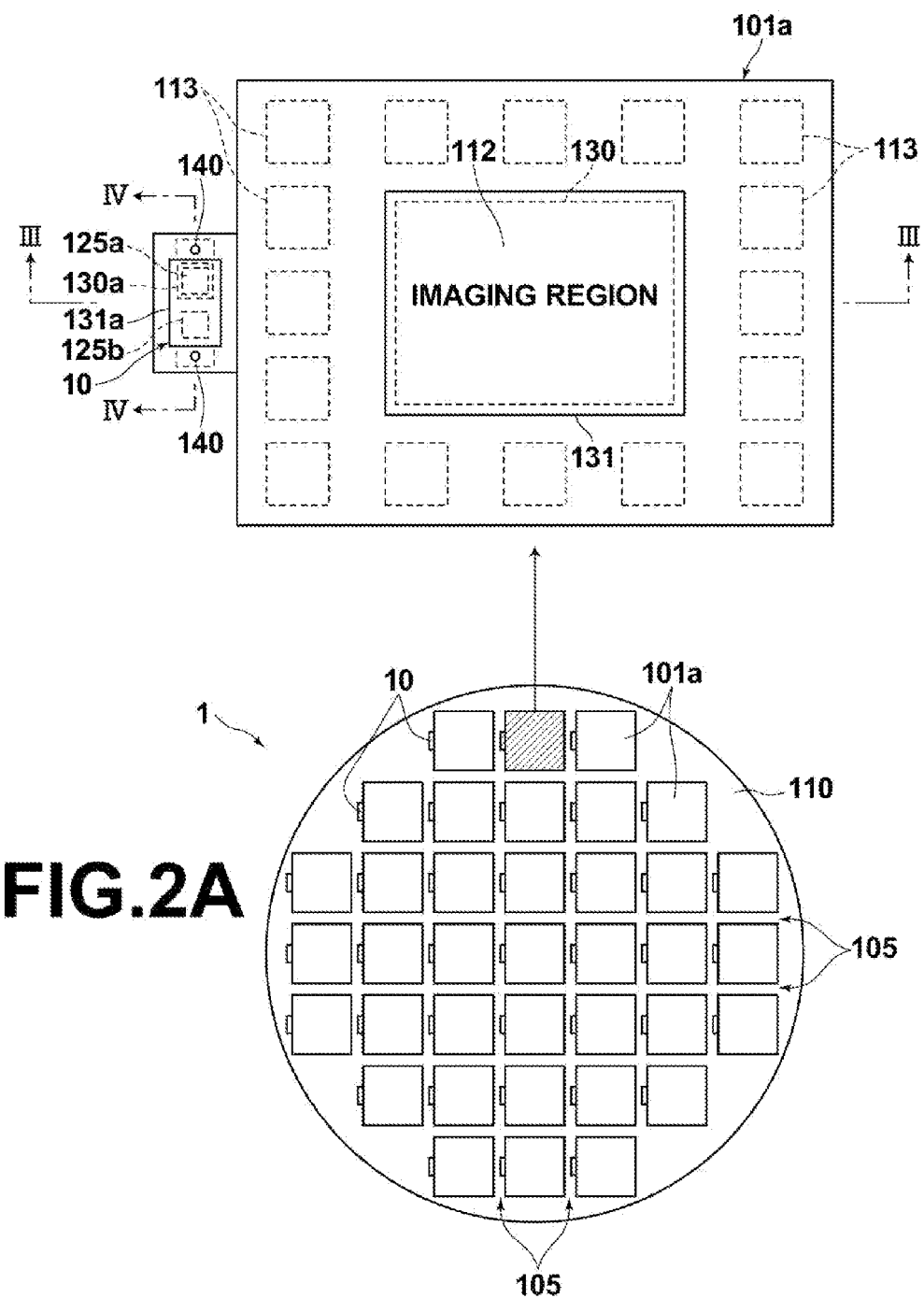

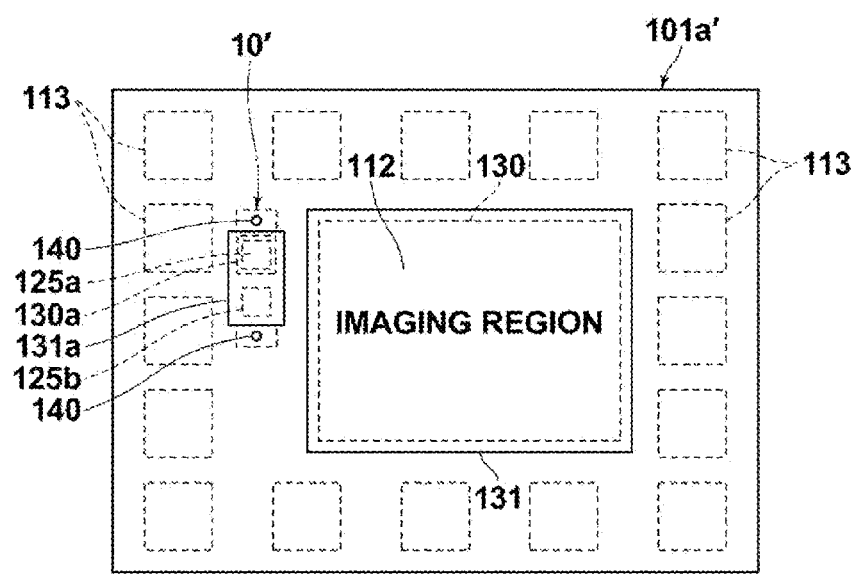

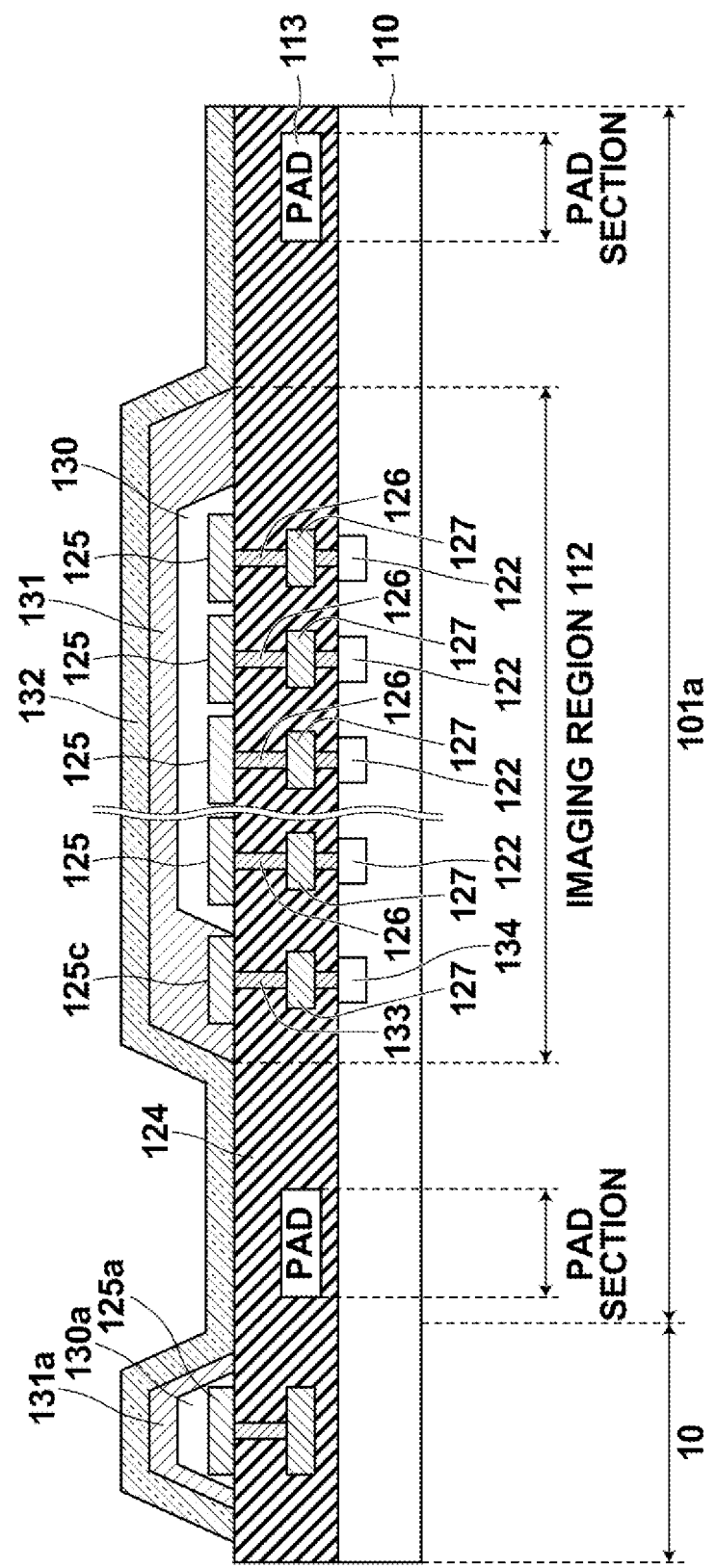

WAFER FOR FORMING IMAGING ELEMENT, METHOD FOR MANUFACTURING SOLID-STATE IMAGING ELEMENT, AND IMAGING ELEMENT CHIP

CROSS-REFERENCE TO RELATED APPLICATIONS

This application is a Continuation of PCT International Application No. PCT/JP2013/002010 filed on Mar. 25, 2013, which claims priority under 35 U.S.C. §119(a) to Japanese Patent Application No. 2012-078609 filed on Mar. 30, 2012. The above application(s) is hereby expressly incorporated by reference, in its entirety, into the present application.

BACKGROUND OF THE INVENTION

1. Technical Field

The present invention relates to a wafer for forming an imaging element which is generated in the manufacturing process of a solid-state imaging element, a method for manufacturing the solid imaging element, and an imaging element chip.

2. Background Art

In recent years, a solid-state imaging elements, such as an organic CMOS sensor and the like, which includes an organic photoelectric conversion layer at a light receiving portion and the upper portion of which is covered by a protective film, has been proposed as a new solid-state imaging element in place of conventional silicon type solid-state imaging elements (Japanese Unexamined Patent Publication No. 2011-216853) and the like. This is an imaging device provided with a photodiode which is manufactured by forming an organic photoelectric conversion film above a signal reading circuit formed on a silicon substrate. When manufacturing this device, the signal reading circuit is formed by a standard semiconductor process. Therefore, a method for inspecting the signal reading circuit during its manufacture is established. In contrast, a method for inspecting the organic photoelectric conversion film is not sufficiently established. A defect inspection for the organic photoelectric conversion film is essential to improve productivity.

The above Japanese Unexamined Patent Publication No. 2011-216853 proposes a configuration in which a test pattern is constructed in a position different from that of an imaging region and a terminal can be electrically connected to the outside so as to inspect defects of an organic photoelectric conversion film during manufacturing of a solid-state imaging element. This configuration enables the organic photoelectric conversion film to be inspected without influencing the imaging region irrespective of whether the defect inspection method is a destructive inspection or a non-destructive test.

SUMMARY OF THE INVENTION

However, Japanese Unexamined Patent Publication No. 2011-216853 does not disclose a configuration of an inspection unit for inspecting the organic photoelectric conversion film in detail.

The organic photoelectric conversion film is susceptible to oxygen, moisture, and the like, and fluctuations in the characteristic of the organic photoelectric conversion film caused by penetration thereof are drastic. Therefore, it is essential to form a protective film on the organic photoelectric conversion film after formation thereof so as to prevent the contact of the organic photoelectric conversion film with the outside air. Accordingly, it is realistic that a defect inspection is conducted after the protective film is formed.

The Patent Publication discloses a configuration, in which the protective film is not formed over a testing terminal by patterning so as to enable the testing terminal to access the outside.

However, performing a patterning for forming the protective film is difficult due to its production process. Further, there is a case that the protective film formed by patterning cannot obtain sufficient protection performance and adhesiveness.

In addition, the Patent Publication does not disclose the inspection method for inspecting the organic photoelectric conversion film in detail.

It is necessary to establish and employ an inspection method suitable for organic photoelectric conversion films in order to perform the inspection method effectively because the organic photoelectric conversion film has characteristics different from conventional Si photodiodes.

The present invention has been made in view of the foregoing circumstances, it is an object of the present invention to provide a wafer for forming having a configuration that enables a protective film to have a sufficient protection function for each imaging region and that enables the quality of each organic photoelectric conversion film to be inspected without influencing the imaging region during the process of manufacturing imaging elements. In addition, it is another object of the present invention to provide a method for manufacturing an imaging element including the organic photoelectric conversion film with a high yield.

A wafer for forming an imaging element of the present invention includes:

a semiconductor wafer provided with a signal reading circuit;

a plurality of imaging element units formed on the semiconductor wafer, each of the imaging element units having an imaging region including a great number of photoelectric conversion pixels;

a test pattern formed in a region other than the imaging region on the semiconductor wafer; and a protective film, wherein each of the photoelectric conversion pixels includes a pixel electrode, an organic photoelectric conversion film and a counter electrode which are laminated in the recited order on the semiconductor wafer;

the test pattern includes a testing organic photoelectric conversion film and a testing counter electrode formed thereon having the same configuration and formed at the same time as the organic photoelectric conversion film and the counter electrode, respectively, of the photoelectric conversion pixels; a first testing terminal electrically connected to the undersurface side of the testing organic photoelectric conversion film; and a second testing terminal electrically connected to the testing counter electrode; and the protective film is formed over the entire semiconductor wafer so as to cover the imaging region and the test pattern, and is then partially removed so that a part of the first testing terminal and a part of the second testing terminal are exposed.

It is desirable for the test pattern to be provided on a dicing line between imaging element units on the semiconductor wafer.

The wafer for forming an imaging element can be configured in such a manner that the test pattern includes a first testing electrode and a second testing electrode which are formed at the same time as the pixel electrode and which are made of the same material as the pixel electrode;

the testing organic photoelectric conversion film is formed over the first testing electrode and the testing counter electrode is famed to cover the testing organic photoelectric conversion film and the second testing electrode; and the first testing terminal is electrically connected to the undersurface side of the testing photoelectric conversion film through the first testing electrode and the second testing terminal is electrically connected to the testing counter electrode through the second testing electrode.

A method for manufacturing a solid-state imaging element of the present invention includes the steps of:

manufacturing the wafer for forming an imaging element of the present invention;

inspecting and determining the quality of the wafer for forming an imaging element by contacting the first testing terminal and the second testing terminal in the test pattern of the wafer for forming an imaging element with a contact needle probe from the outside and performing a functional inspection of the testing organic photoelectric conversion film;

terminating continuation of following manufacturing steps in the case that the wafer for forming an imaging element is determined to be defective in the inspecting step and continuing the following manufacturing steps in the case that the wafer for forming an imaging element is determined to be non-defective.

The functional inspection can be performed by contacting the test pattern with an external circuit through the contact needle probe, applying a reverse voltage into the organic photoelectric conversion film to cause a current to flow therethrough, and detecting light emission from the organic photoelectric conversion film.

Another method for manufacturing a solid-state imaging element of the present invention includes the steps of:

manufacturing the wafer for forming an imaging element of the present invention;

inspecting and determining the quality of an imaging region corresponding to the test pattern for forming an imaging element by contacting the first testing terminal and the second testing terminal in the test pattern of the wafer for forming an imaging element with a contact needle probe from the outside and performing a functional inspection of the testing organic photoelectric conversion film;

terminating continuation of following manufacturing steps in the case that the imaging region is determined to be defective in the inspecting step and continuing the following manufacturing steps in the case that the imaging region is determined to be non-defective.

The functional inspection can be performed by contacting the test pattern with an external circuit through the contact needle probe, irradiating the test pattern with light having a single wavelength, and detecting a current which has flown to the external circuit in a state that a positive voltage is applied into the organic photoelectric conversion film.

Note that the positive voltage may be swept to detect the current.

The functional inspection can be performed by contacting the test pattern with an external circuit through the contact needle probe and detecting a change in a dark current which flows to the external circuit in a state that a positive voltage is applied into the organic photoelectric conversion film.

Note that the positive voltage may be swept to detect the dark current.

An imaging element chip of the present invention includes:

a semiconductor substrate provided with a signal reading circuit;

an imaging element unit formed on the semiconductor substrate, the imaging element unit having an imaging region including a great number of photoelectric conversion pixels;

a test pattern formed in a region other than the imaging region on the semiconductor substrate; and a protective film, wherein each of the photoelectric conversion pixels includes a pixel electrode, an organic photoelectric conversion film and a counter electrode which are laminated in the recited order on the semiconductor substrate;

the test pattern includes a testing organic photoelectric conversion film and a testing counter electrode formed thereon having the same configuration and formed at the same time as the organic photoelectric conversion film and the counter electrode, respectively, of the photoelectric conversion pixels; a first testing terminal electrically connected to the undersurface side of the testing organic photoelectric conversion film; and a second testing terminal electrically connected to the testing counter electrode; and the protective film is formed over the entire semiconductor wafer so as to cover the imaging region and the test pattern, and is then partially removed so that a part of the first testing terminal and a part of the second testing terminal are exposed.

The wafer for forming an imaging element of the present invention has a configuration in which a protective film is formed over the entire surface of the wafer and a part of each of testing terminals is exposed. This enables the protective film to attain high adhesiveness and further a protection performance for protecting organic photoelectric conversion films to be sufficient.

The wafer for forming an imaging element of the present invention enables the quality of a wafer and/or the quality of each of organic photoelectric conversion films of imaging regions to be determined by a functional inspection of testing organic photoelectric conversion films of test patterns at an early stage during the process of manufacturing an imaging element. Thereby, a cost reduction can be achieved compared to a case that the inspection is performed only at the end of the process because no extra process is required for defective products.

The method for manufacturing a solid-state imaging element of the present invention enables the quality of the wafer for forming an imaging element and the quality of each of organic photoelectric conversion films of imaging regions to be determined by a functional inspection of testing organic photoelectric conversion films of test patterns at an early stage during the manufacturing process. Thereby, a cost reduction can be achieved compared to a case that the inspection is performed only at the end of the process because no extra process is required for defective products.

BRIEF DESCRIPTION OF THE DRAWINGS

FIG. 2A is a plan view and a partial enlarged view of a wafer for forming an imaging element.

FIG. 2B is a plan view illustrating an example of design changes of an imaging element section.

FIG. 3 is a diagram that schematically illustrates the cross section taken along line in FIG. 2A.

DESCRIPTION OF THE PREFERRED EMBODIMENTS

Hereinafter, embodiments of the present invention will be described in detail with reference to the accompanying drawings.

Figure 1:
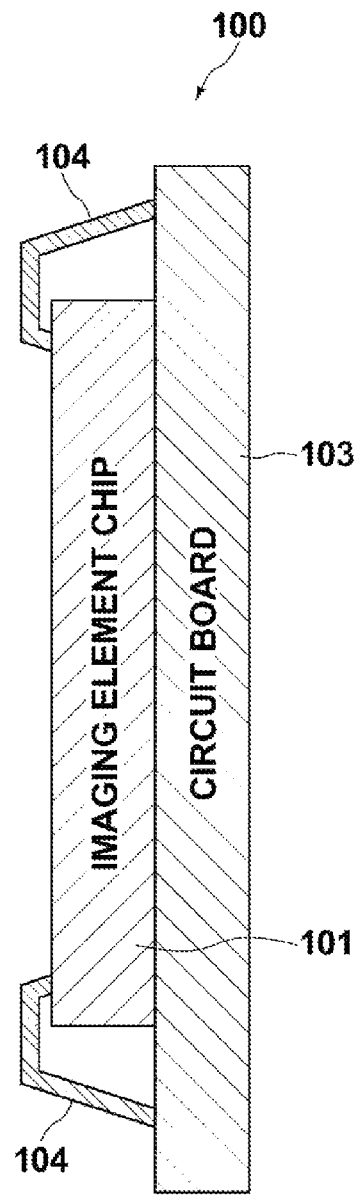
FIG. 1 is a diagram that schematically illustrates the traverse cross section of a solid-state imaging element 100.

First, the configuration of a solid-state imaging element 100 will be briefly described. FIG. 1 is a diagram that schematically illustrates the traverse cross section of the solid-state imaging element 100. This solid-state imaging element 100 is equipped with an imaging element chip 101 and a circuit board 103 attached to the back side of the imaging element chip 101.

An area of the circuit board 103 is larger than that of the imaging element chip 101. The imaging element chip 101 is attached to the center portion of the circuit board 103. Connection pads are formed at a peripheral portion of the imaging element chip 101, i.e., a peripheral portion of an imaging region. Each of the connection pads is bonded to the circuit board 103 by a wire 104.

The imaging element chip 101 is an individual piece formed from a wafer for forming an imaging element of the present invention. FIG. 2A is a plan view and a partial enlarged view of the wafer for forming an imaging element of the present invention.

The wafer 1 for forming an imaging element of the present invention includes a semiconductor wafer 110, imaging element units 101a, each having an imaging region 112 including a great number of photoelectric conversion pixels formed on the wafer 110 by applying a technology for manufacturing a semiconductor device and a technology for forming a film, and test patterns 10, each of which corresponds to each of the imaging element units 101a formed in dicing lines 105 between the imaging element units 101a.

The sizes of the imaging region and each photoelectric conversion pixel differ according to specifications. As an example, the size of the imaging region is approximately 5 mm×5 mm and the size of the pixel is approximately between 0.9 µm×0.9 µm and 3 µm×3 µm.

Each of the imaging element units 101a is formed to be rectangular on the semiconductor wafer 110. Each of the imaging element units 101a includes the rectangular imaging region 112 formed in the center portion thereof and connection pads 113 formed at a peripheral portion of the imaging region 112.

The imaging element chip 101 is formed by dicing the wafer 1 for forming an imaging element into individual pieces and includes the imaging element unit 101a formed on a semiconductor board thereon. In the case that the test patterns 10 are provided on the dicing lines 105 in the same manner as in the present embodiment, the entirety or a portion of each of the test patterns 10 may remain on an imaging element chip 101 that is a diced individual piece. This is, however, optional.

Although it is favorable for the test patterns 10 to be formed on the dicing lines 105 in the same manner as in the present embodiment, each of the test patterns 10 may be disposed in a region other than regions of connection pads 113 and an imaging region 112 required within each of the imaging element units 101a.

For example, a test pattern 10' may be disposed between the imaging region 112 and the connection pads 113 as shown in an imaging element unit 101a' of FIG. 2B. In the case that each of the test pattern 10 is disposed within each imaging element unit 101a, the test pattern 10 will remain within a diced imaging element chip 101. Therefore, a diced imaging element chip, which is formed by separating the imaging element unit 101a' shown in FIG. 2B from the wafer, corresponds to an imaging element chip of the embodiment of the present invention.

Figure 4:
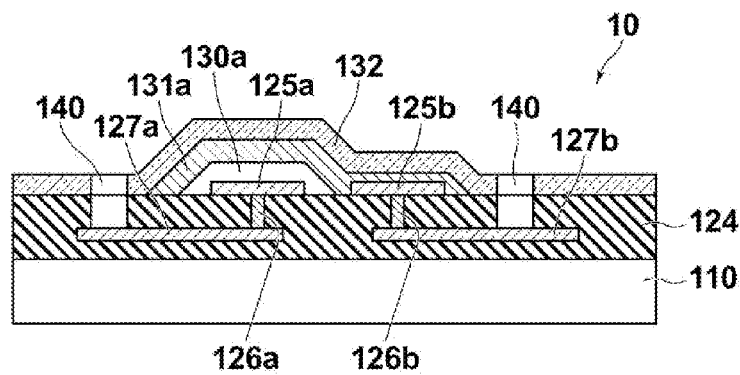
FIG. 4 is a diagram that schematically illustrates the cross section taken along line IV-IV in FIG. 2A.

FIG. 3 is a diagram that schematically illustrates the cross section taken along line in FIG. 2A and is a diagram that schematically illustrates the traverse section of an imaging element unit 101a and a test pattern 10. FIG. 4 is a diagram that schematically illustrates the cross section taken along line IV-IV in FIG. 2A and is a diagram that schematically illustrates the cross section of the test pattern 10. Note that the cross section of the test pattern 10' shown in FIG. 2B is the same as that of each of the test patterns 10 shown in FIG. 3 and FIG. 4.

The semiconductor wafer 110 includes signal reading circuits 122, each of which corresponds to each pixel and includes a signal charge storage unit, in each imaging element unit. Each of the signal reading circuits 122 is a MOS transistor circuit (not shown) corresponding to each pixel in the same manner as a general CMOS image sensor. Each signal reading circuit 122 reads out a signal according to a stored charge of the signal charge storage unit corresponding to the signal reading circuit 122, as an imaged image signal, to the outside through the corresponding connection pad 113.

Note that each of the signal reading circuits 122 may be a CCD type. A metal wiring layer (not shown) and an insulation layer 124 are laminated on the semiconductor wafer 110.

First, the configuration of each imaging unit 101a will be described.

The pixel electrodes 125 which individually correspond to pixels are arranged in a two-dimensional array shape within an imaging region 122 on the insulation layer 124 on the semiconductor wafer 110.

Examples of materials for the pixel electrodes 125 include a metal, metal oxide, metal nitride, metal boride, organic conductive compound, their mixtures, and the like. Specific examples include conductive metal oxides such as tin oxide, zinc oxide, indium oxide, Indium Tin Oxide (ITO), indium zinc oxide (IZO), indium tungsten oxide (IWO), titanic oxide, and the like; metal nitride such as titanium nitride (TiN), and the like; metals such as gold (Au), platinum (Ft), silver (Ag), chromium (Cr), nickel (Ni), aluminum (Al); mixtures or laminated materials of these metals and conductive metal oxides; organic conductive compounds such as polyaniline, polythiophene, polypyrrole and the like; laminated materials of these compounds and ITO; and the like. Any of titanium nitride, molybdenum nitride, tantalum nitride, and tungsten nitride is specifically preferable for the materials of the pixel electrodes 125.

A bias voltage applying electrode 125c made of the same material as the pixel electrodes 125, for applying a bias voltage into a counter electrode 131, is formed outside the region in which all the pixel electrodes 125 are disposed within the imaging region 112. Further, the bias voltage applying electrode 125c and the pixel electrodes 125 are formed on the same surface.

Each of the pixel electrodes 125 is electrically connected to each signal charge storage unit 122 corresponding to the same pixel thereas through each via plug 126 which erects within the insulation layer 124. Individually separated metal films 127 are embedded along each via plug 126 within the insulation layer 124 and the metal films 127 can respectively block out light for the signal charge storage units 122. Each of the metal films 127 is formed after the lower half of the insulation layer 124 is laminated. Then, the upper half of the insulation layer 124 is laminated thereon.

An organic photoelectric conversion film 130 is laminated over the respective pixel electrodes 125. The organic photoelectric conversion film 130 is shared among the pixel electrodes 125 for each imaging region.

Figure 5:
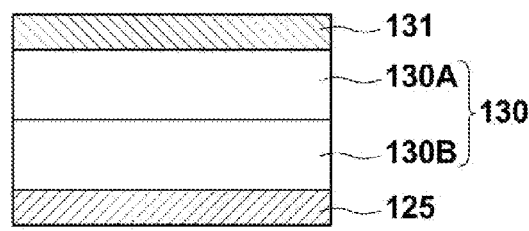
FIG. 5 is a diagram that schematically illustrates the cross section of an organic photoelectric conversion film.

As shown in the diagrammatic cross-sectional view of the organic photoelectric conversion film in FIG. 5, the organic photoelectric conversion film 130 consists of a photoelectric conversion layer 130A and a charge blocking layer 130B formed thereunder (on the side of the semiconductor substrate) in the present embodiment.

The charge blocking layer 130B is a layer for preventing charges (for example, electrons) from being injected from the pixel electrodes 125 into the photoelectron conversion layer 130A. Note that two or more charge blocking layers 1303 may be provided between each pixel electrode 125 and the photoelectric conversion layer 130A.

The photoelectric conversion layer 130A is configured to include organic photoelectric conversion materials which receive light and generate charges (electrons and positive hole) according to the amount of the light. In this case, materials which have the sensitivity over the entire range of visible light are applied for the photoelectric conversion layer 130A.

Specific examples of the materials for the charge blocking layer 130B and the photoelectric conversion layer 130A can include the materials disclosed in Japanese Unexamined Patent Publication No. 2011-216853 as appropriate. Note that a buffer layer may be provided between the charge blocking layer and the photoelectric conversion layer, and then another layer may be further provided therebetween.

At least photoelectric conversion layer among a plurality of layers that constitute the organic photoelectric conversion film 130 is made of organic materials. The other layers including the charge blocking layer may be made of organic materials or may be made of inorganic materials.

A counter electrode 131 made of ITO and the like, which is of a single-sheet configuration and which transmits visible light, is laminated on the organic photoelectric conversion film 130 so as to cover the organic photoelectric conversion film 130.

The counter electrode 131 is connected to a high-concentration impurity layer 134 of the semiconductor wafer 110 by a via plug 133. A required voltage is externally applied to the counter electrode 131 via the high-concentration impurity layer 134, a wiring layer (not shown), and the corresponding connection pads 113.

Examples of materials for the counter electrode 131 include a metal, metal oxide, metal nitride, metal boride, organic conductive compound, their mixtures, and the like. Specific examples include conductive metal oxides such as tin oxide, zinc oxide, indium oxide, Indium Tin Oxide (ITO), indium zinc oxide (IZO), indium tungsten oxide (IWO), titanic oxide, and the like; metal nitride such as TiN, and the like; metals such as gold (Au), platinum (Pt), silver (Ag), chromium (Cr), nickel (Ni), aluminum (Al); mixtures or laminated materials of these metals and conductive metal oxides; organic conductive compounds such as polyaniline, polythiophene, polypyrrole and the like; laminated materials of these compounds and ITO; and the like.

Each of the photoelectric conversion pixels includes each of the pixel electrodes 125, the organic photoelectric conversion film 130, and the counter electrode 131 in the imaging region 112.

A protective film 132 is formed over the counter electrode 131. The entire imaging element unit is covered by the protective film 132. Note that an opening is provided on each connection pad 113 immediately before performing wire bonding.

The protective film 132 is a thin film of materials that have both a protection function (denseness which prevents moisture and oxygen from infiltrating) of the photoelectric conversion film 130 and transparency. The protective film 132 is capable of sufficiently making the visible light enter the photoelectric conversion film 130 when a light transmittance at wavelength of 400 nm through 700 nm is greater than or equal to 80%.

It is preferable for the protective film 132 to be a film formed by an inorganic material with an ALCVD method. The ALCVD method is an Atomic-layer CVD method capable of forming a dense inorganic film which can be a protective film that is effective for the photoelectric conversion film. The ALCVD method is also known as an ALE method or an ALD method. It is preferable for the inorganic material which should be formed into a film by the ALCVD method to be inorganic oxide (for example, $Al_2O_3$, $SiO_2$, $TiO_2$, $ZrO_2$, $MgO$, $HfO_2$, $Ta_2O_5$), and $Al_2O_3$ is the most effective thereamong.

Note that another protective film may be formed on or beneath the protective film 132 so as to improve the protection function of the photoelectric conversion film 130. In this case, the protection film is a silicon-oxide-nitride film (SiON film), for example. Note that in particular, the configuration with another protective film formed on the protective film 132 has superior protection effect.

As described above, the ALCVD method is applied for forming a protective film and a uniform protective film is formed over the entire wafer surface. More specifically, the protective film is formed over the entire region including the imaging element unit as well as the test pattern and the dicing line.

Next, a configuration of the test pattern 10 will be described.

Each of the test patterns 10 includes a testing electrode 125a, a testing organic photoelectric conversion film 130a which is formed to cover the testing electrode 125a, a testing counter electrode 131a which is formed to cover the testing organic photoelectric conversion film 130a, a testing electrode 125b electrically connected to the testing counter electrode 131a, a metal wiring layer 127a which is formed within the insulation layer 124 and is electrically connected to the testing electrode 125a through a via plug 126a, and a metal wiring layer 127b which is formed within the insulation layer 124 and is electrically connected to the testing electrode 125b through a via plug 126b.

In the present embodiment, the metal wiring layer 127a, which is connected to the undersurface of the testing organic photoelectric conversion film 130a through the testing electrode 125a and the via plug 126a, is a first testing terminal. The metal wiring 127b, which is connected to the testing counter electrode 131a through the testing electrode 125b and the via plug 126b, is a second testing terminal.

The protective film provided over the imaging region is continuously formed on the test pattern 10. However, the insulation layer 124 and the protective film 132 on the metal wiring layers 127a and 127b are partially removed and openings 140 are provided so that a portion of each of the metal wiring layers 127a and 127b is exposed.

The testing electrode 125a and the testing electrode 125b are formed by the same material as that of the pixel electrode 125 and at the same time that the pixel electrode 125 is manufactured. Further, the testing organic photoelectric conversion film 130a is formed by the same material and at the same time as the photoelectric conversion film 130 in the imaging region.

In addition, the metal wiring layers 127a and 127b are formed by the same process as the metal film 127 of the imaging region 112. Further, the via plugs 126a and 126b are formed by the same process as the via plug 126 of the imaging region 112.

The width (a direction perpendicular to the dicing line 105) of each of the test patterns 10 is equal to the width which is the greatest among those of the pixel electrode 125a, the organic photoelectric conversion film 130a, and the counter electrode 131a. Any of the widths of the pixel electrode 125a, the organic photoelectric conversion film 130a, and the counter electrode 131a may be the greatest, but the pixel electrode 125 should not directly contact with the counter electrode 131a.

It is preferable for each of the test patterns to be respectively formed on the dicing lines in the same manner as the present embodiment. In this case, the width of the test pattern should not exceed the width of the dicing line. The width of the dicing line is approximately 160 μm, for example.

The wafer for forming an imaging element configured in the manner described above is manufactured in the manufacturing process of the imaging element chip of the solid-state imaging element 100. In this wafer for forming an imaging element, it is possible to inspect whether the testing photoelectric conversion film 130a of the test pattern has sufficient photoelectric conversion function by contacting the testing terminals 127a and 127b with a contact needle probe to have them contact with an external circuit without exposing the connection pads 113. Thereby, the quality of a photoelectric conversion film 130 of an imaging region 112 corresponding to each test pattern 10 can be determined. Note that buffer amplifiers may be disposed between the testing terminal 127a and the pixel electrode and between the testing terminal 127b and the counter electrode. In this case, the buffer amplifiers are provided within the semiconductor wafer.

Note that the connection pads 113 remains to be covered by the insulation layer 124 until bonding of the wires 104 shown in FIG. 1 is performed. An opening is made on each connection pad 113 immediately before performing bonding, and a surface of each connection pad 113 is slightly removed so that a clean surface thereof can be exposed to obtain favorable electric connection.

As a result of the judgment of the quality, the wafer for forming an imaging element, a photoelectric conversion film of which has been determined to be non-defective, will be diced into individual pieces, and then each individual piece will be placed at a predetermined position on the circuit board to make an opening on each connection pad and perform wire bonding thereon as shown in FIG. 1. Thereby, a solid-state imaging element 100 will be obtained.

In photoelectric conversion film lamination type solid-state imaging element chip having such a configuration, incident light passing through the protective film 132 and the counter electrode 131 and then entering the organic photoelectric conversion film 130 generates positive holes and electron pairs within the organic photoelectric conversion film 130 according to the amount of the light entered thereinto. The positive holes flow to the counter electrode 131 while the electrons flow to the signal charge storage units 122 through the respective pixel electrodes 125. Then, imaged image signals according to the amount of stored charges of the signal charge storage units 122 are read out by the signal reading circuit.

Examples of design changes of the test patterns will be described.

Figure 6:
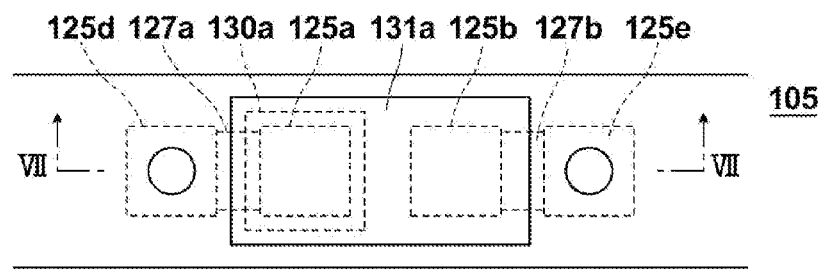
FIG. 6 is a schematic plan view of a test pattern of the example 1 of design changes.
Figure 7:
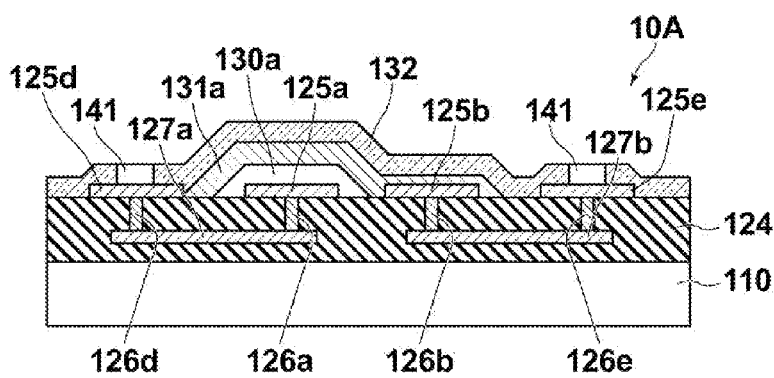
FIG. 7 is a schematic cross-sectional view of a test pattern of the example 1 of design changes.

FIG. 6 is a schematic plan view of a test pattern of the example 1 of design changes. FIG. 7 is a schematic cross-sectional view thereof. Note that the same reference numerals respectively denote the same parts as those of the test pattern 10 of the aforementioned embodiment, and detailed descriptions thereof will be omitted.

As shown in FIG. 6 and FIG. 7, a test pattern 10A of the example 1 of design changes includes a first contact needle electrode 125d and a second contact needle electrode 125e which are arranged next to the testing electrodes 125a and 125b, in addition to the configuration of the test pattern 10 described above. The first contact needle electrode 125d is connected to a first metal wiring layer 127a through a via plug 126d. This first contact needle electrode 125d corresponds to a first testing terminal in the present embodiment. The second contact needle electrode 125e is connected to a second metal wiring layer 127b through a via plug 126e. This second contact needle electrode 125e corresponds to a second testing terminal in the present embodiment.

The openings 141 to expose the first contact needle electrode 125d and the second contact needle electrode 125e are formed by removing only the protective film.

Figure 8:
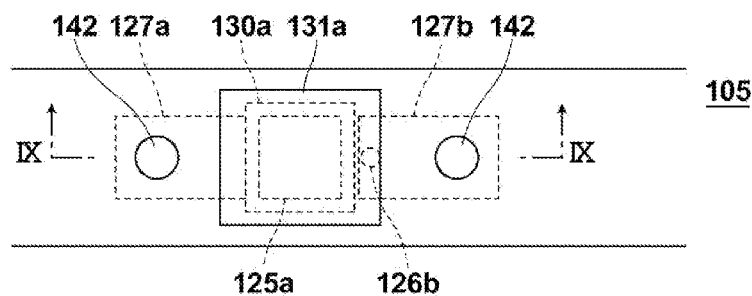
FIG. 8 is a schematic plan view of a test pattern of the example 2 of design changes.
Figure 9:
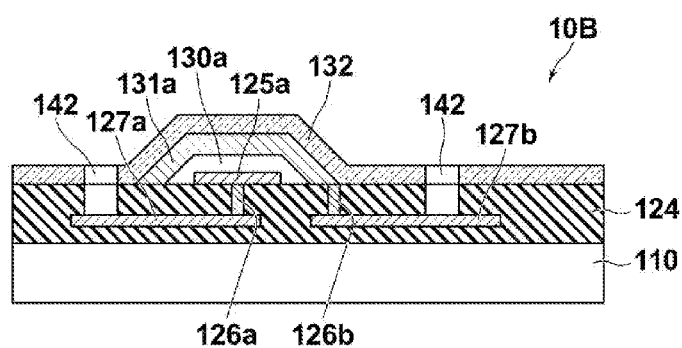
FIG. 9 is a schematic cross-sectional view of a test pattern of the example 2 of design changes.

FIG. 8 is a schematic plan view of a test pattern of the example 2 of design changes. FIG. 9 is a schematic cross-sectional view thereof. The same reference numerals respectively denote the same parts as those of the test pattern 10 of the aforementioned embodiment, and detailed descriptions thereof will be omitted.

As shown in FIG. 8 and FIG. 9, a test pattern 10B of the example 2 of design changes does not include the testing electrode 125b of the configuration of the aforementioned test pattern 10. Here, a via plug 126b is configured to directly contact with a testing counter electrode 131a.

The test pattern 10B is the same as the test pattern 10 in that the metal wiring layer 127a connected to the testing electrode, 125a through the via plug 126a is a first testing terminal and the metal wiring layer 127b connected to the via plug 126b is a second testing terminal. Further, the test pattern 10B is also the same as the test pattern 10 in that each opening 142 for a contact needle is formed by partially removing the protective film 132 and the insulation layer 124.

Any of the test patterns 10, 10A, and 10B of the configurations can be formed at the same time in the process of forming photoelectric conversion pixels of the imaging regions.

Next, the method for manufacturing the aforementioned solid-state imaging element 100 will be described.

A film of a conductive material for the pixel electrodes 125 is formed on the insulation layer 124 on the semiconductor wafer, which includes the signal reading circuit 122 as well as a metal wiring layer and an interlayer insulation layer 124 formed on the surface thereof. Next, the formed conductive material film is subjected to patterning by photolithography and etching, and then pixel electrodes 125, a bias voltage applying electrode 125c, and testing electrodes 125a and 125b are formed at the same time.

Next, a mask having openings only in regions where the pixel electrodes 125 within each imaging region and the pixel electrode 125a of the test pattern are formed is prepared. Using this mask, an organic photoelectric conversion film 130 and a testing organic photoelectric conversion film 130a are formed at the same time over the plurality of pixel electrodes 125 in each imaging region and on the testing electrode 125a, respectively.

Next, a counter electrode 131 to cover the organic photoelectric conversion film 130 in each imaging region 112 and a testing counter electrode 131a to cover the testing organic photoelectric conversion film 130a of each test pattern 10 are formed. The mask having openings in regions to be provided with counter electrodes is employed again to form a counter electrode 131 and a testing counter electrode 131a at the same time.

Next, a uniform protective film 132 is formed over the entire wafer surface including the imaging regions 112 and the test patterns 10. The protective film 132 are formed by the CVD method as described above.

Thereafter, the protective film 132 and the insulation 124 are partially removed by etching so that the first testing terminal 127a and the second testing terminal 127b of each testing pattern 10 are exposed.

Note that after the formation of the protective film 132, a color filter may be formed on the protective film 132 over each imaging region 112 before exposing the testing terminals.

The process as described above enables a wafer 1 for forming an imaging element including a great numbers of imaging element units 101a and test patterns 10 to be manufactured as shown in the diagram at the lower half of FIG. 2A.

Next, the quality of organic photoelectric conversion films 130 of the wafer 1 for forming an imaging element or the quality of an organic photoelectric conversion film 130 of each imaging region on the wafer 1 for forming an imaging element can be determined by inspecting the testing photoelectric conversion film of each test pattern 10.

The photoelectric conversion layer which is composed of organic materials easily deteriorates due to a small amount of water vapor and oxygen. Therefore, a defect inspection prior to forming a protective film must be conducted under an inert gas atmosphere (nitrogen and the like). This is, however, difficult from the viewpoint of the process (because the organic film through the protective film are formed in a consistent vacuum). In addition, after the inspection, there is a possibility that the photoelectric conversion layer will deteriorate prior to formation of the productive film or during the formation thereof. Therefore, a defect inspection should be conducted after the productive film is formed.

A dense protective film is significant in order to effectively cut off gas such as oxygen, water vapor, and the like which are very fine particles. As mentioned above, the ALCVD method enables a dense protective film to be formed.

However, the ALCVD method has problems in the characteristics thereof that it is difficult to form a film locally (patterning) by using a mask due to the flow of reaction gas which is a material for forming a film. Therefore, it is difficult for the protective film to obtain performance for protecting imaging regions and sufficient adhesiveness during formation of the protective film without forming a film over the testing terminal.

The present configuration, in which a film is formed over the entire wafer surface of the protective film and then contact needle portions are opened, facilitates the formation of the protective film. In addition, it is preferable for a protective film to be formed over the entire surface from the viewpoint of the adhesiveness and protection function compared to a case that a protective film locally.

The inspection method will be described. There are three methods for the inspection below, and any of them may be employed. Note that a first inspection method is an inspection method for determining the quality of the wafer 1 for forming an imaging element, itself. A second inspection method and a third inspection method are inspection methods for determining the quality of each of the imaging regions in the wafer 1 for forming an imaging element.

A First Inspection Method

Figure 10:
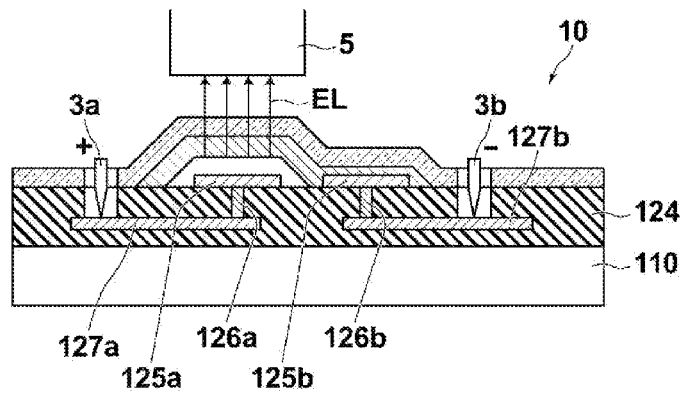
FIG. 10 is a view explaining a first inspection method.

FIG. 10 is a view explaining a first inspection method. The test pattern 10 is the same as that shown in FIG. 4.

Probes 3a and 3b are inserted into openings 140 and probe tips are respectively brought into contact with the first testing terminal and the second testing terminal 127a and 127b so that an external circuit (not shown) is connected to a test pattern 10. A voltage in a direction opposite from the general direction is applied into a testing organic photoelectric conversion film 130a so that a current flows through the testing organic photoelectric conversion film and the testing organic photoelectric conversion film is caused to emit light.

When the imaging element of the present configuration is driven in a general mode, a voltage is applied thereinto such that a counter electrode is positive and each pixel electrode is negative. However, in the present inspection, a testing counter electrode 131a is negative (−) and a testing electrode 125a is positive (+). It is desirable for the voltage to be within the range between 5V and 30V. In addition, when the inspection method is performed, it is desirable for the size of the testing organic photoelectric conversion film of the test pattern to be greater than or equal to 50 μm×5 μm.

The light-emitting EL is detected by a CCD camera 5 disposed upward of the testing photoelectric conversion film 130a. It is desirable for the CCD camera 5 to be capable of detecting in a region up to the infrared region (less than or equal to 1100 nm).

Figure 11:
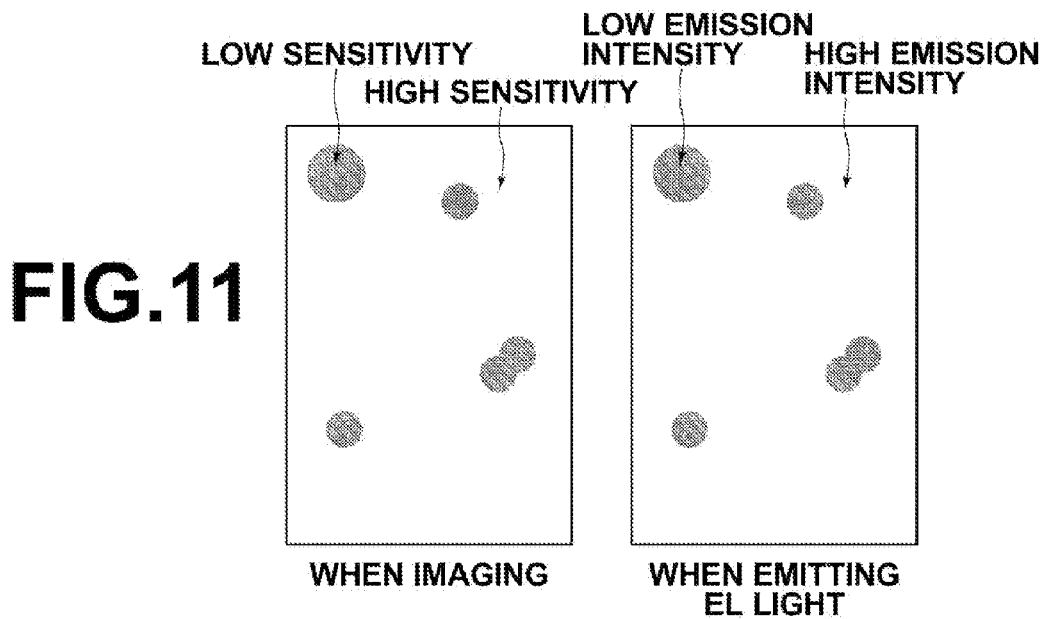
FIG. 11 is a schematic diagram illustrating the correspondence between the sensitivity when imaging a photoelectric conversion element and the intensity of emitted EL light.

FIG. 11 is a schematic diagram illustrating the correspondence between the sensitivity when imaging a photoelectric conversion element and the intensity of emitted EL light. As shown in FIG. 11, it is made it clear from a previous examination that an EL light emission intensity is low at portions (dark portion) where the sensitivity is low when imaging the photoelectric conversion element while an EL light emission intensity is high at portions (bright portion) where the sensitivity is high when imaging the photoelectric conversion element.

Information of the presence or absence of defects is obtained from this intensity distribution of the EL light emission and the quality of photoelectric conversion films on the wafer is determined. Defects can be caused over the entire region of the wafer due to the influence of a work environment in the process of forming films. One of the problems caused by the defects which have occurred during formation of films is a phenomenon which causes the sensitivity to be low over several pixels. This is caused by a gas such as water vapor, oxygen, and the like entering through tiny holes on a film surface from the outside and being spread thereover. The holes on the film surface are attributed to fine dust on a substrate and the holes themselves are not serious defects. These holes may be uniformly present over the entire substrate surface. These holes caused by fine dust are influenced equally by oxygen, the concentration of water vapor, and exposure time in a work environment irrespective of places. Therefore, inspecting a test pattern enables a state of a film over the entire wafer to be estimated. Consequently, in the case that the intensity distribution of the light emission as shown in FIG. 11 is represented in a test pattern, it will be estimated that the sensitivity is varied as well in each imaging region on the wafer. For example, a threshold value is provided for a density at portions where the light emission intensity is low in the test pattern. If a value is greater than or equal to the threshold value, the wafer will be determined to be defective. If a value is less than or equal to the threshold value, the wafer will be determined to be non-defective.

Note that in the embodiments shown in FIGS. 2A and 2B, a singular test pattern is provided for a singular imaging region. In the present inspection method, only one test pattern may be provided on the wafer. Alternatively, a plurality of test patterns may be formed with some distance apart from each other on the wafer irrespective of the number of the imaging regions.

In the case that it is determined by the first inspection method that the wafer 1 for forming an imaging element is non-defective, the manufacturing process will be continued. In the case that it is determined that the wafer 1 is defective, the manufacturing process will be terminated.

That is, the wafer 1 for forming an imaging element which has been determined to be non-defective by the first inspection method will be diced to a plurality of imaging element chips 101. Then, each of the imaging element chips 101 will be placed on the circuit board 103 and the clean surface of each connection pad 113 of the imaging element chip 101 will be exposed. A solid-state imaging element 100 will be manufactured by performing wire bonding between each connection pad 113 and the circuit board 103.

A Second Inspection Method

Figure 12:
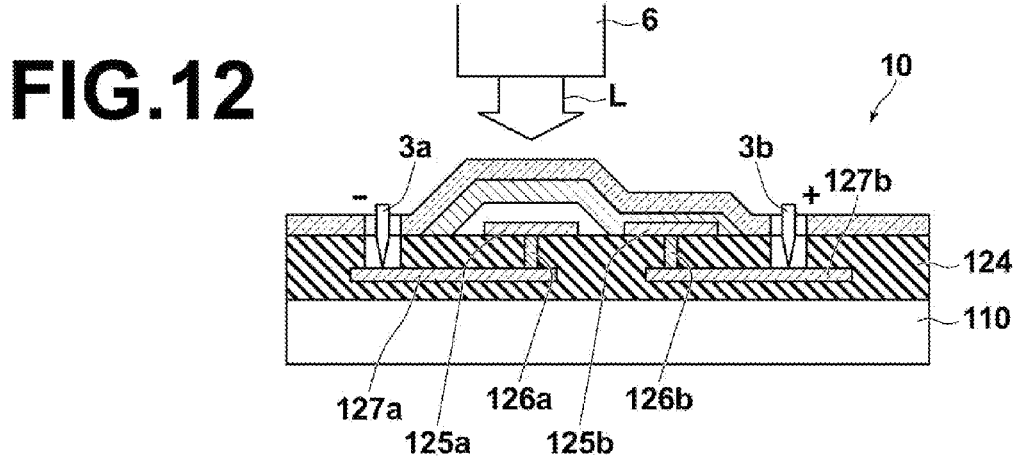
FIG. 12 is a view explaining a second inspection method.

FIG. 12 is a view explaining a second inspection method. The test pattern 10 is the same as that of FIG. 4.

Probes 3a and 3b are inserted into openings 140 and probe tips are respectively brought into contact with the first testing terminal and the second testing terminal 127a and 127b so that an external circuit (not shown) is connected to a test pattern 10. Further, a voltage in the same direction as in the general drive is applied into a testing organic photoelectric conversion film 130a.

In this state, the testing organic photoelectric conversion film 130a is irradiated with light L having a single wavelength by using a light source 6 disposed on the testing organic photoelectric conversion film 130a. The wavelength of the light L is in the visible light region (380 through 780 nm).

Along with the irradiation with the light L, a current flown to an external circuit is detected and the sensitivity of the imaging element is identified from the value thereof.

A numerical value of photoelectric current is set in advance to determine the quality. If the value is less than the numerical value, the quality may be determined to be defective. If the value is greater than or equal to the numerical value, the quality may be determined to be non-defective.

Note that the quality can be detected by the dark current when the general drive voltage is applied, or the quality can be detected more clearly by sweeping the applied voltage.

Figure 13:
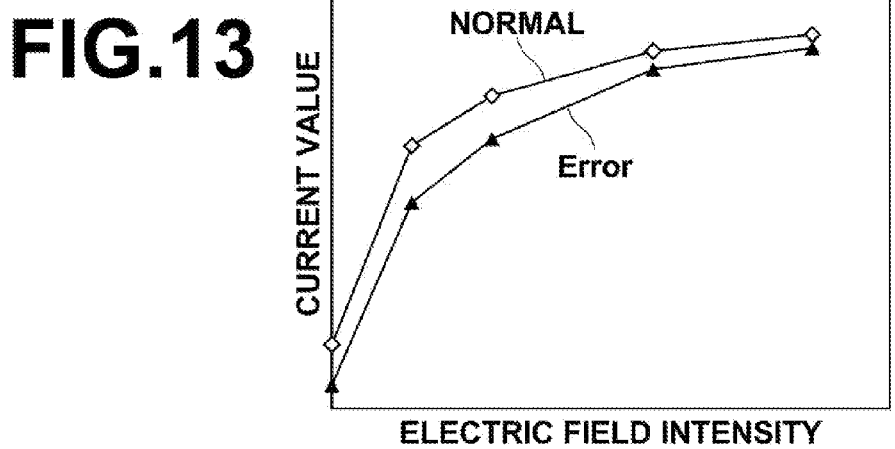
FIG. 13 is a graph schematically showing changes in photocurrents of normal and defective elements in the case that a voltage is swept in the second inspection method.

FIG. 13 is a graph schematically showing changes in current values of being non-defective (normal) and of being defective (Error) in the case that a voltage is swept. The electric field intensity increases toward the right side in a horizontal axis.

Sweeping the voltage enables the differences between the case of normal and the case of error to be made clear as shown in FIG. 13 even though distinguishing the difference therebetween by the general drive voltage is difficult. The method for determining the quality by sweeping the voltage in such a manner is a method which is peculiar to the organic imaging element, utilizing the electrical feature of the organic film, which is voltage dependency.

A Third Inspection Method

Figure 14:
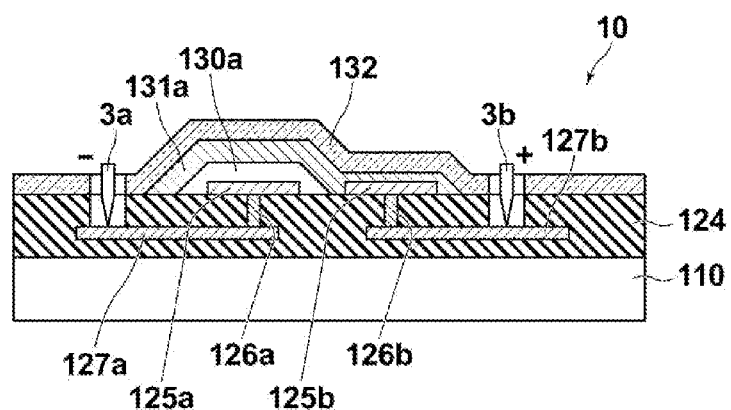
FIG. 14 is a view explaining a third inspection method.

FIG. 14 is a view explaining a third inspection method. The test pattern 10 is the same as that of FIG. 4.

Probes 3a and 3b are inserted into openings 140 and probe tips are respectively brought into contact with the first testing terminal and the second testing terminal 127a and 127b so that an external circuit (not shown) is connected to a test pattern 10.

A voltage (positive voltage) in the same direction as in the general drive is applied into a testing organic photoelectric conversion film 130a in this state and a dark current at that time is measured.

Measuring the dark current enables a state of the film to be checked (if a film has a defect therewithin, currents could upwell due to thermal excitation) and the presence or absence of short circuit to be checked (there is a short circuit between electrodes, the value of the dark current will be extremely large).

The quality may be determined from the difference between the numerical values based on the dark current in a normal mode as a reference, as well.

Note that the quality can be detected by the dark current when the general drive voltage is applied, or the quality can be detected more clearly by sweeping the applied voltage.

Figure 15:
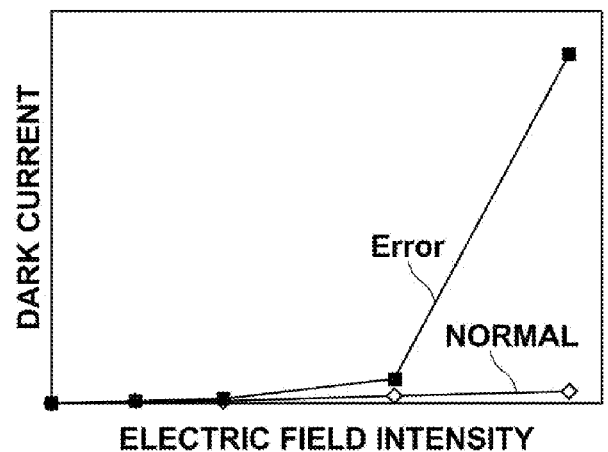
FIG. 15 is a graph schematically showing changes in dark currents of normal and defective elements in the case that a voltage is swept in the third inspection method.

FIG. 15 is a graph schematically showing changes in the dark current values of being non-defective (normal) and of being defective (Error) in the case that a voltage is swept. The electric field intensity increases toward the right side in a horizontal axis.

Sweeping the voltage enables the differences between the case of normal and the case of error to be made clear as shown in FIG. 15 even though distinguishing the difference therebetween by the general drive voltage is difficult. The method for determining the quality by sweeping the voltage in such a manner is a method which is peculiar to the organic imaging element, utilizing the electrical feature of the organic film, which is voltage dependency.

In the second and third inspection methods described above, one test pattern may be provided for one imaging region so that one test pattern is employed for determining the quality of one imaging region as shown in FIG. 2. Alternatively, one test pattern may correspond to a plurality imaging regions. For example, in the case that a test pattern is disposed on a dicing line, the test pattern may be used for determining the quality of two adjacent imaging regions, between which the test pattern is disposed.

In addition to the aforementioned inspection, the quality of the organic photoelectric conversion film can be determined by measuring an optical response speed thereof.

Note that the wafer 1 for forming an imaging element, which has been determined to be non-defective by the first inspection method, may be further subjected to the second or third inspection method to determine the quality of each imaging region.

After the quality of each imaging element unit is determined by the second or third inspection method, imaging element chips 101 are obtained by dicing the wafer 1 for forming an imaging element. In the case an imaging element chip 101 including an imaging element which has been determined to be non-defective by the above inspection, following manufacturing steps will be continued. In the case that an imaging element chip 10 including an imaging element which has been determined to be defective, the manufacturing process will be terminated.

The solid-state imaging element 100 can be manufactured by using only the imaging element chip 101 that includes the imaging element unit which has been determined to be non-defective by the second or third inspection method. More specifically, the solid-state imaging element 100 is manufactured by placing the imaging element chip 101 on the circuit board 103, exposing a clean surface of each connection pad 113 of the imaging element chip 101, and performing wire bonding between this connection pad 113 and the circuit board 103.

As described above, the inspection for determining the quality of the wafer 1 for forming an imaging element or the quality of each imaging region 112 in the wafer 1 for forming an imaging region in a stage prior to dicing is performed by the first inspection method, the second inspection method, and the third inspection method. This enables the manufacture yield of the solid-state imaging element 100 to be improved and a cost reduction of manufacturing the solid-imaging element 100 to be attained.

Figure 16:
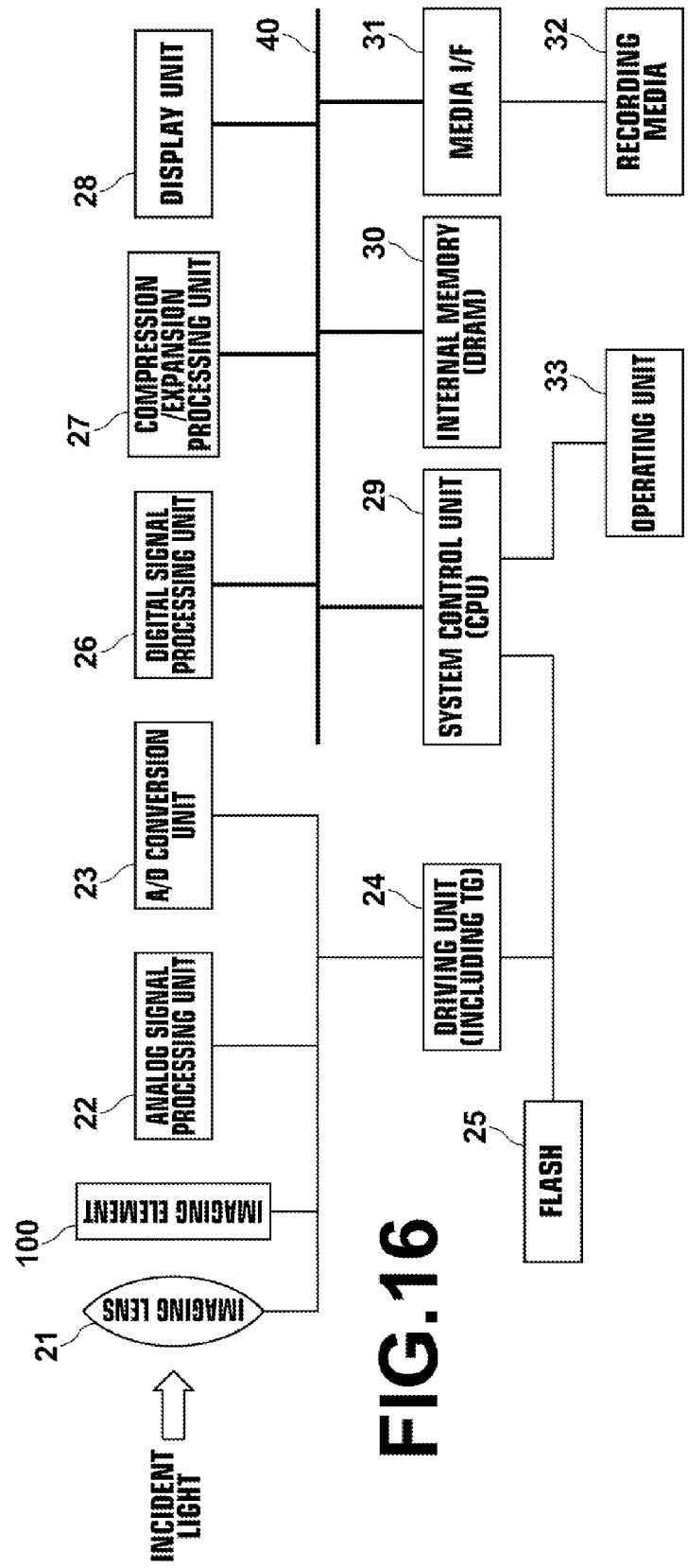
FIG. 16 is a block diagram of a digital camera equipped with the solid imaging element obtained by a method for manufacturing a solid-state imaging element of the present invention.

FIG. 16 is a block diagram of a digital camera equipped with the solid imaging element manufactured by the manufacturing method of the present invention, which is one embodiment of the imaging apparatus. This digital camera includes a solid-state imaging element 100; an imaging lens 21 disposed in the front of the solid-state imaging element 100; an analog signal processing unit 22 which performs analog processing such as an automatic gain control (AGC) or correlation double sampling processing on analog image data output from the solid-state imaging element 100; an analog digital conversion unit (A/D) 23 which converts the analog image data output from the analog signal processing unit 22 into digital image data; a drive unit (which includes a timing generator) 24 which controls the driving of the imaging lens 21, the A/C 23, the analog signal processing unit 22, and the solid-state imaging element 100 in response to an instruction from a system control unit (CPU) 29 to be described below; and a flash 25 which emits light in response to an instruction from the CPU 29.

The digital camera of the present embodiment further includes a digital signal processing unit 26 which retrieves digital image data output from the A/D 23 and performs interpolating processing, a white balance correction, RGB/YC conversion processing, and the like; a compression/extension processing unit 27 which compresses the image data into image data of a JPEG type or the like or extends the compressed data; a display unit 28 which displays a menu or the like or displays through images and imaging images; a system control unit (CPU) 29 which integrally controls the entire digital camera; an internal memory 30 such as a frame memory or the like; a media interface (I/F) unit 31 which performs interface processing between the unit 31 and a recording media 32 for storing JPEG image data and the like; and a bus 40 which interconnects therebetween. Further, the system control unit 29 is connected to an operation unit 33 which performs an instruction input from a user.

The wafer and the manufacturing method of the present invention enable a solid-state imaging element to be obtained with a satisfactory yield. Therefore, an imaging apparatus equipped with the solid-state imaging element as described above can be manufactured at low cost.

What is claimed is:

1. A method for manufacturing a solid-state imaging element comprising the steps of:
    manufacturing the wafer for forming an imaging element of comprising:
        a semiconductor wafer for provided with a signal reading circuit;
        a plurality of imaging element units formed on the semiconductor wafer, each of the imaging element units having an imaging region including a great number of photoelectric conversion pixels;
        a test pattern formed in a region other than the imaging region on the semiconductor wafer; and
        a protective film, wherein
        each of the photoelectric conversion pixels includes a pixel electrode, an organic photoelectric conversion film and a counter electrode which are laminated in the recited order on the semiconductor wafer;
        the test pattern includes a testing organic photoelectric conversion film and a testing counter electrode formed thereon having the same configuration and formed at the same time as the organic photoelectric conversion film and the counter electrode, respectively, or the photoelectric conversion pixels; a first testing terminal electrically connected to the undersurface side of the testing organic photoelectric conversion film; and a second testing terminal electrically connected to the testing counter electrode; and
        the protective film is formed over the entire semiconductor wafer so as to cover the imaging region and the test pattern, and is then partially removed so the a part of the first testing terminal and a part of the second testing terminal are exposed;
    inspecting and determining the quality of the wafer for forming an imaging element by contacting the first testing terminal and the second testing terminal in the test pattern of the wafer for forming an imaging element with a contact needle probe from the outside and performing a functional inspection of the testing organic photoelectric conversion film;
    terminating continuation of following manufacturing steps in the case that the wafer for forming an imaging element is determined to be defective in the inspecting step and continuing the following manufacturing steps in the case that the wafer for forming an imaging element is determined to be non-defective,
    wherein the functional inspection is performed by contacting the test pattern with an external circuit through the contact needle probe, applying a reverse voltage into the organic photoelectric conversion film to cause a current to flow therethrough, and detecting light emission from the organic photoelectric conversion film.

* * * * *